(12) United States Patent
Sugimoto et al.

(10) Patent No.: US 9,685,974 B1
(45) Date of Patent: Jun. 20, 2017

(54) SWITCHED CAPACITOR CIRCUIT

(71) Applicant: KABUSHIKI KAISHA TOSHIBA, Tokyo (JP)

(72) Inventors: Tomohiko Sugimoto, Yokohama Kanagawa (JP); Hirotomo Ishii, Kawasaki Kanagawa (JP); Kentaro Yoshioka, Setagaya Tokyo (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 15/253,800

(22) Filed: Aug. 31, 2016

(30) Foreign Application Priority Data

Mar. 14, 2016 (JP) ................................. 2016-050123

(51) Int. Cl.
*H03M 1/66* (2006.01)
*H03M 1/46* (2006.01)

(52) U.S. Cl.
CPC ............. *H03M 1/66* (2013.01); *H03M 1/466* (2013.01)

(58) Field of Classification Search
CPC .......... H03M 1/66; H03M 1/466; H03M 3/37; H03M 3/43; H03M 3/454; H03M 3/35; H03M 3/452; H03M 3/464; H03M 3/424; H03M 3/46; H03M 3/44
USPC ................................................ 341/150–165
See application file for complete search history.

(56) References Cited

U.S. PATENT DOCUMENTS

| 6,768,436 B1 * | 7/2004 | Chuang ................. H03M 3/364 341/143 |
| 6,972,705 B1 * | 12/2005 | Fei .......................... H03M 3/39 341/143 |
| 8,223,058 B2 | 7/2012 | Kobayashi et al. |
| 2009/0201051 A1 | 8/2009 | Ono et al. |

(Continued)

FOREIGN PATENT DOCUMENTS

| JP | 2006121480 A | 5/2006 |
| JP | 2009027281 A | 2/2009 |

(Continued)

OTHER PUBLICATIONS

Soon-Kyun Shin et al., "A Fully-Differential Zero-Crossing-Based 1.2V 10b 26MS/s Pipelined ADC in 65 nm CMOS", IEEE, Symposium on VLSI Circuits Digest of Technical Papers, 2008, pp. 218-219.

(Continued)

*Primary Examiner* — Lam T Mai
(74) *Attorney, Agent, or Firm* — Patterson & Sheridan, LLP

(57) ABSTRACT

A switched capacitor circuit includes a first sampling circuit having a first sampling capacitance element. The first sampling circuit receives an input voltage and outputs a sampled voltage according to a first sampling operation. A quantizer quantizes the sampled voltage output from the first sampling circuit and outputs a quantized value corresponding to the sampled voltage. A digital-to-analog converter outputs an analog signal in accordance with the quantized value from the quantizer. A first logic circuit outputs an instruction to (Continued)

start a sampling operation of a second sampling circuit, which is configured to sample the analog signal output from the digital-to-analog converter, when the quantizer completes quantization of the sampled voltage.

20 Claims, 13 Drawing Sheets

(56) References Cited

U.S. PATENT DOCUMENTS

2010/0328119 A1    12/2010  Kobayashi et al.
2016/0352349 A1*  12/2016  Yoshioka .............. H03M 1/124

FOREIGN PATENT DOCUMENTS

| JP | 2009027282 A | 2/2009 |
|----|--------------|--------|
| JP | 2013153246 A | 8/2013 |

OTHER PUBLICATIONS

Ahmed M. A. Ali et al., "A 16-bit 250-MS/s IF Sampling Pipelined ADC With Background Calibration", IEEE Journal of Solid-State Circuits, vol. 45. No. 12, Dec. 2010, pp. 2602-2612.

* cited by examiner

SWITCHED CAPACITOR CIRCUIT

CROSS-REFERENCE TO RELATED APPLICATION

This application is based upon and claims the benefit of priority from Japanese Patent Application No. 2016-050123; filed Mar. 14, 2016, the entire contents of which are incorporated herein by reference.

FIELD

Embodiments described herein relate generally to a switched capacitor circuit.

BACKGROUND

In the related art, a switched capacitor circuit including an operational amplifier is known as an amplifier circuit that amplifies an analog signal with a predetermined gain. According to such a switched capacitor circuit, a virtual ground voltage more closely approaches an ideal value and the amplification precision is further enhanced as the gain of the operational amplifier increases. However, as CMOS type devices have decreased further in size in recent years, it becomes more difficult to design an operational amplifier with a high gain while still meeting target device sizes. The amplifier circuit in the related art thus has a problem that an amplification error increases with decreased device sizes.

A switched capacitor circuit including a comparator instead of the operational amplifier has also been proposed. However, the switched capacitor circuit in this instance causes an amplification error in accordance with a finite delay in the comparator.

DETAILED DESCRIPTION

In general, according to one embodiment, a switched capacitor circuit includes a first sampling circuit having a first sampling capacitance element and receiving an input voltage and outputting a sampled voltage according to a first sampling operation, a quantizer configured to quantize the sampled voltage output from the first sampling circuit and output a quantized value corresponding to the sampled voltage, a digital-to-analog converter that outputs an analog signal in accordance with the quantized value from the quantizer, and a first logic circuit configured to output an instruction to start a sampling operation of a second sampling circuit configured to sample the analog signal output from the digital-to-analog converter when the quantizer completes quantization of the sampled voltage.

There is a case where a sampling circuit having a plurality of switches is connected to a later stage of an amplifier circuit. In such a case, a leakage current occurs due to the switches of a later-stage sampling circuit operating with an elapse of time even if the amplifier circuit precisely performs amplification. As a result, sampling properties of the later-stage sampling circuit are adversely influenced. The influence particularly appears in an amplifier circuit that operates at a low-speed clock. A similar situation also occurs in a switched capacitor circuit including an integrator circuit, for example.

Hereinafter, description will be given of example embodiments with reference to drawings. Although an amplifier circuit and an integrator will be exemplified as a switched capacitor in the description of the example embodiments, the present disclosure is not limited thereto.

1. First Embodiment

1-1. Configuration

Figure 1:
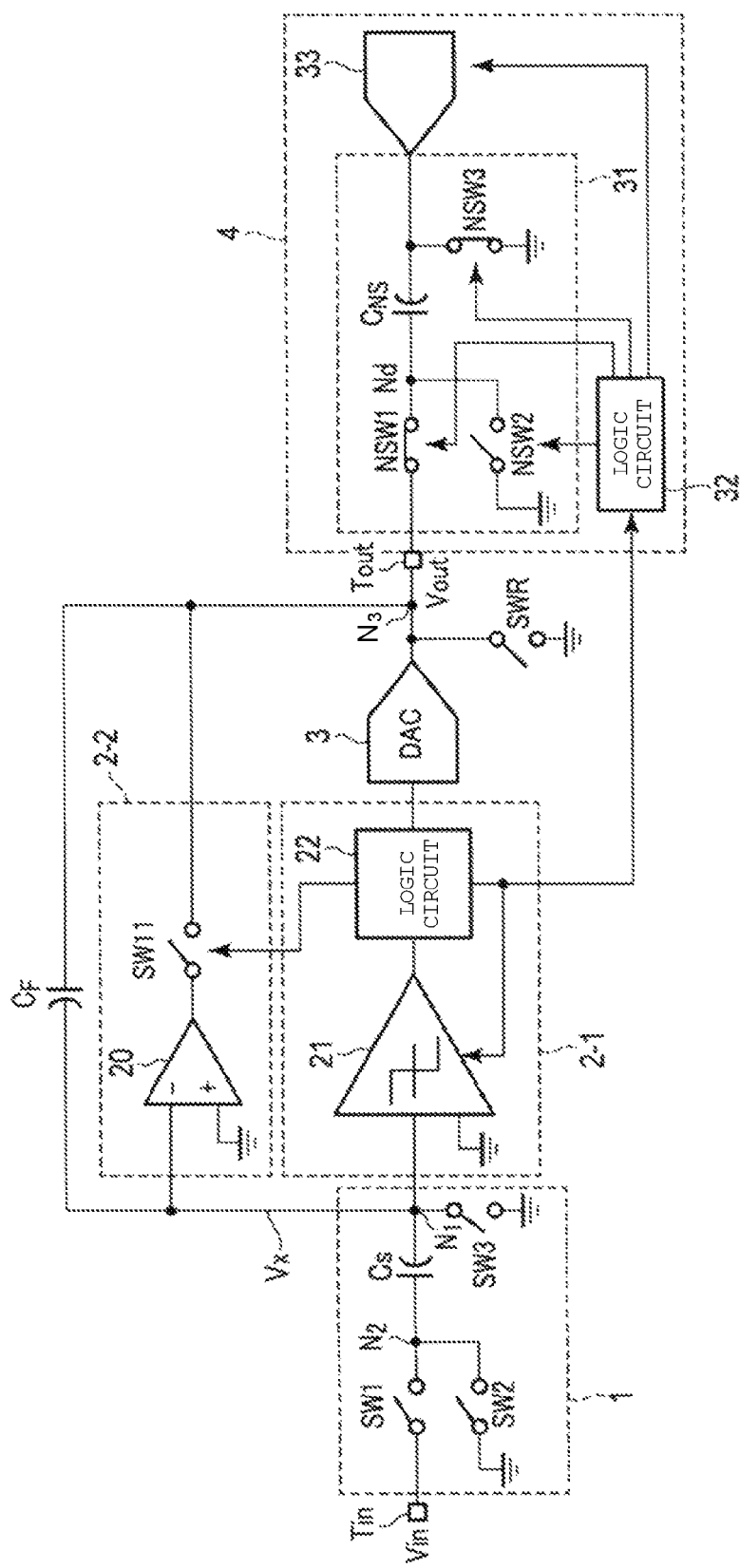
FIG. 1 is a diagram illustrating a configuration of an amplifier circuit according to a first embodiment.

FIG. 1 is a diagram illustrating a configuration of an amplifier circuit according to a first embodiment.

According to the amplifier circuit of the first embodiment, an input voltage Vin is input from an input terminal Tin, and the input voltage Vin is amplified by a predetermined amplification factor and output as an output voltage Vout from an output terminal Tout. The amplifier circuit can be considered to include two operation phases, namely a sampling phase for sampling the input voltage Vin and an amplification phase for amplifying the sampled input voltage Vin.

As illustrated in FIG. 1, the amplifier circuit includes a sampling circuit 1, a quantizer 2-1, an amplifier 2-2, a DA (digital-to-analog) converter (DAC) 3, a feedback capacitance $C_F$, and a reset switch SWR.

Here, an AD (analog-to-digital) converter (ADC) 4 is connected to the output terminal Tout of the DAC 3. The ADC 4 includes a later-stage sampling circuit 31, a logic circuit 32, and a quantizer 33. In FIG. 1, the sampling circuit 1 and the later-stage sampling circuit 31 are switched capacitor circuits. However, the sampling circuit 1 and the later-stage sampling circuit 31 are not necessarily limited to the specific internal structures depicted in FIG. 1 and other switch capacitor circuit structures may be adopted for these elements.

The sampling circuit 1 has an input connected to the input terminal Tin and an output connected to a node $N_1$. The node $N_1$ is a connecting point between the quantizer 2-1 and the feedback capacitance $C_F$. That is, the sampling circuit 1 is connected between the input terminal Tin and the quantizer 2-1. An input voltage Vin is input to the sampling circuit 1, and the sampling circuit 1 outputs a voltage $V_X$ at node $N_1$.

The sampling circuit 1 is a switched capacitor circuit including switches SW1 to SW3 and a sampling capacitance $C_S$.

The switch SW1 has one end connected to the input terminal Tin and the other end connected to a node $N_2$. The node $N_2$ is a connecting point between the switches SW1 and SW2 and the sampling capacitance $C_S$. The one end of the switch SW1 is the input of the sampling circuit 1.

The switch SW2 has one end connected to the node $N_2$ and the other end grounded (connected to a reference potential). Here, ground voltage is assumed to be Vcm (which is 0 V).

The switch SW3 has one end connected to the node $N_1$ and the other end grounded. The sampling capacitance $C_S$ has one end connected to the node $N_2$ and the other end connected to the node $N_1$. A connecting point (N1) between the switch SW3 and the sampling capacitance CS is the output of the sampling circuit 1.

In the sampling circuit 1 depicted in FIG. 1, the switches SW1 and SW3 are turned on (closed) while the switch SW2 is turned off (open) in a first part of the sampling phase. In doing so, the sampling capacitance $C_S$ samples the input voltage Vin. At this time, the voltage $V_X$ is 0 V.

In the sampling circuit 1 of FIG. 1, the switches SW1 and SW3 are turned off (open) while the switch SW2 is turned on (closed) in a second part of the sampling phase. In doing so, the voltage $V_X$ becomes −Vin (negative of the input voltage Vin).

In the first embodiment, the quantizer 2-1 is a successive approximation-type ADC (SAR-ADC). The quantizer 2-1 executes 1-bit quantization in a plurality of cycles in the amplification phase and generates a digital code D. As illustrated in FIG. 1, the quantizer 2-1 includes a comparator 21 and a logic circuit 22.

The amplifier 2-2 includes an operational amplifier 20 and a switch SW 11. The quantizer 2-1 and the amplifier 2-2 operate in the amplification phase of the amplifier circuit.

The operational amplifier 20 has a first input terminal (an inverting input terminal) connected to the output (node $N_1$) of the sampling circuit 1, and the voltage $V_X$ is input to the first input terminal thereby. The operational amplifier 20 has a second input terminal (a non-inverting input terminal) grounded, and thus the voltage Vcm (e.g., ground voltage) is input thereto. The switch SW 11 is connected between the operational amplifier 20 and the node $N_3$.

Although an operational amplifier 20 will be used in this example embodiment, the present disclosure not limited thereto. For example, an analog amplifier such as a ring amplifier may also be used.

During an initial predetermined period of the amplification phase, the logic circuit 22 turns on (closes) the switch SW 11, and the operational amplifier 20 operates. At this time, the output voltage Vout is represented by the following equation.

[Equation 1]

$$Vout = Vin \frac{C_S}{C_F} \quad (1)$$

After elapse of the initial predetermined period, the logic circuit 22 turns off (opens) the switch SW 11, and the logic circuit 22 instructs (controls) the comparator 21 to start a successive approximation operation.

The comparator 21 (first comparator) has a first input terminal connected to the output (node $N_1$) of the sampling circuit 1, and the voltage $V_X$ is input thereto. The comparator 21 has a second input terminal grounded, and the voltage Vcm is input thereto. The comparator 21 compares voltage $V_X$ with (voltage Vcm) and outputs a digital value (0 or 1) in accordance with a result of the comparison. The comparator 21 thus operates as a 1-bit quantizer.

The logic circuit 22 is a control circuit that controls the comparator 21. The logic circuit 22 causes the comparator 21 to compare voltage $V_X$ with 0 (voltage Vcm) in a plurality of cycles of the amplification phase, generates the digital code D with the digital value obtained in each cycle, and outputs the digital code D to the DAC 3. That is, the successive approximation operation of the quantizer 2-1 (SAR-ADC) is realized by the logic circuit 22 controlling the comparator 21.

Figure 9:
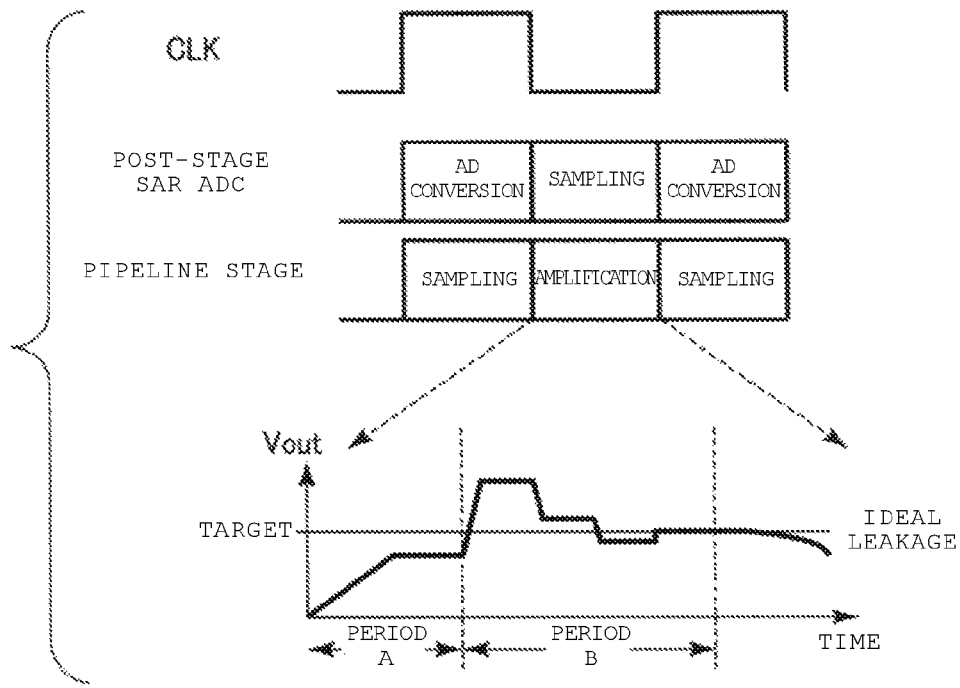
FIG. 9 is a diagram for explaining influence of a leakage current of an output voltage from an amplifier circuit in the related art.

The logic circuit 22 outputs a conversion completion signal to the logic circuit 32 when the successive approximation operation of the quantizer 2-1 has been completed even before the amplifier circuit completes the amplification phase based on a clock signal CLK ("clock CLK", see, e.g., FIG. 9).

The DAC 3 has an input terminal connected to the output terminal of the logic circuit 22 and an output terminal connected to the node $N_3$. The node $N_3$ is a connecting point between the output of the DAC 3 and the feedback capacitance $C_F$. That is, the DAC 3 is connected between the logic circuit 22 and the output terminal Tout (at which voltage Vout is supplied). The digital code D output from the logic circuit 22 is input to the DAC 3, and the DAC 3 outputs an analog signal obtained by converting the input digital code.

Figure 2:
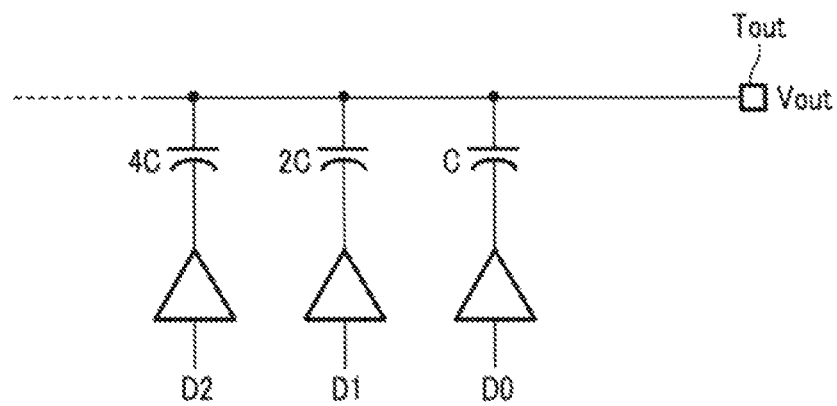
FIG. 2 is a diagram illustrating an example of a digital-analog converter (DAC).

FIG. 2 is a diagram illustrating an example of the DAC 3. The DAC 3 in FIG. 2 is an N-bit capacitance DAC (DCC: Digital-Charge Converter) and outputs an electrical charge in accordance with the digital code. The DAC 3 includes N total buffers (N=3 is depicted in FIG. 2) connected in parallel to which a bit (D0, D1, D2, . . . ) of the digital code D is respectively input and N capacitive elements (C, 2C, 4C . . . ) connected to a corresponding buffer as illustrated in FIG. 2. An electrical charge (referred to as "electrical charge $Q_{INJ}$") output from the DAC 3 in FIG. 2 is represented by the following equation.

[Equation 2]

$$Q_{INJ} = \sum_{n=0}^{N} 2^n C \times D_n \times Vref \quad (2)$$

In Equation (2), C represents a capacitance value of the capacitive element corresponding to a minimum bit, Dn represents a value of an n-th bit of the digital code D (0 or 1), and Vref represents a buffer drive voltage. The feedback capacitance $C_F$ is charged with the electrical charge $Q_{INJ}$ output from the DAC 3. In doing so, the relationship Vout=$Q_{INJ}/C_F$ is satisfied.

If the capacitance-type DAC depicted in FIG. 2 is used as the DAC 3 depicted in FIG. 1, then the DAC 3 can output both positive and negative electrical charges by using a three-state (tri-state) buffer as a buffer or by outputting an intermediate code (such as 100 . . . or 011 . . . ) in the sampling phase.

Figure 3:
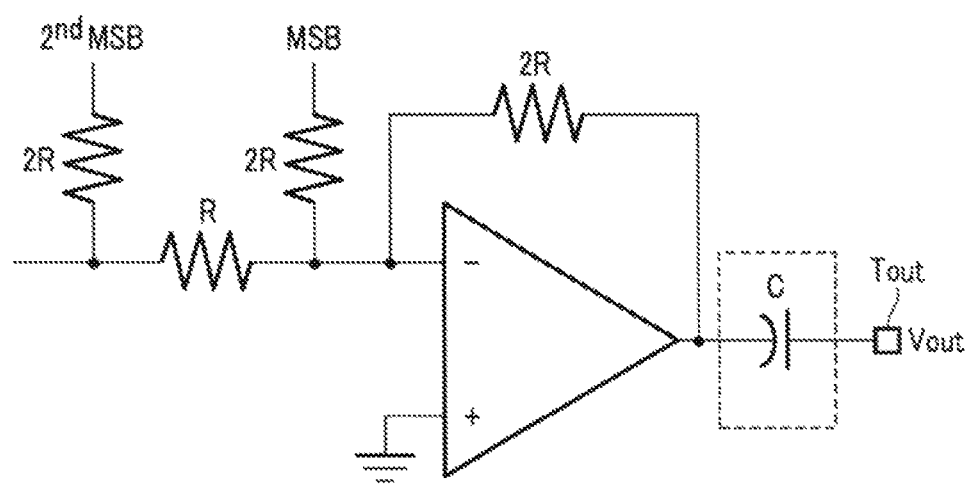
FIG. 3 is a diagram illustrating an example where a capacitive element is connected between the DAC and an output terminal.

The DAC 3 is not limited to the capacitance-type DAC depicted in FIG. 2 and may be an R-2R resistance-type DAC or a ladder-type DAC. However, if a R-2R resistance-type DAC or a ladder-type DAC is used as the DAC 3, it may be preferable to include a capacitive element C between the DAC 3 and the output terminal Tout as illustrated in FIG. 3 in order to convert an output impedance into a high impedance.

The feedback capacitance $C_F$ is connected between the output (node $N_1$) of the sampling circuit 1 and the output terminal (node $N_3$) of the DAC 3. The feedback capacitance $C_F$ forms a feedback circuit connecting the input terminal ($N_1$) of the quantizer 2-1 and the output terminal (node $N_3$) of the DAC 3. The feedback capacitance $C_F$ feedbacks the analog signal output from the DAC 3 to the output (voltage $V_X$) of the sampling circuit 1 in the amplification phase.

The reset switch SWR has one end connected to the output terminal (node $N_3$) and the other end grounded. The reset switch SWR is turned on (closed) in the sampling phase and is turned off (open) in the amplification phase. The electrical charge in the feedback capacitance $C_F$ is reset by the reset switch SWR being turned on.

The logic circuit 32 controls the quantizer 33 and the switches NSW 1 to NSW 3 of the later-stage sampling circuit 31 of the ADC 4 and causes the switches NSW 1 to NSW3 and the quantizer 33 to start an AD conversion operation if the logic circuit 32 receives a conversion completion signal from the logic circuit 22. That is, the logic circuit 22 provides an instruction for starting an operation related to the sampling capacitance sampled by the later-stage sampling circuit 31. The logic circuit 32 starts the operation if the logic circuit 32 receives the instruction for starting the operation from the logic circuit 22.

The later-stage sampling circuit 31 controls sampling in a manner similar to the sampling circuit 1. That is, the later-stage sampling circuit 31 controls the sampling by controlling the switches NSW1 to NSW3. The logic circuit 32 controls the switches NSW1 to NSW3 and completes the sampling if the logic circuit 32 receives the conversion completion signal from the logic circuit 22. The logic circuit 32 controls the quantizer 33 and starts an operation related to the sampling capacitance sampled by the later-stage sampling circuit 31 if the logic circuit 32 receives the conversion completion signal from the logic circuit 22.

1-2. Operation

Next, description will be given of operations of the amplifier circuit according to the first embodiment with reference to FIGS. 4 to 7. Although the following description will be given on the assumption that the DAC 3 is a capacitance-type DAC, the DAC 3 is not limited thereto as described above.

The operation of the amplifier circuit according to the first embodiment in the sampling phase is as described above, and the switches SW1 and SW3 and the reset switch SWR are turned on while the switch SW2 is turned off. In doing so, the sampling capacitance $C_S$ samples the input voltage Vin, and charging with the electrical charge $QC_S$ is performed.

In the amplification phase, the switches SW1 and SW3 and the reset switch SWR are turned off while the switch SW2 is turned on. In doing so, the voltage $V_X$ becomes a constant value in accordance with the input voltage Vin. Also, the logic circuit 22 is activated and executes the successive approximation operation in N cycles.

Figure 4:
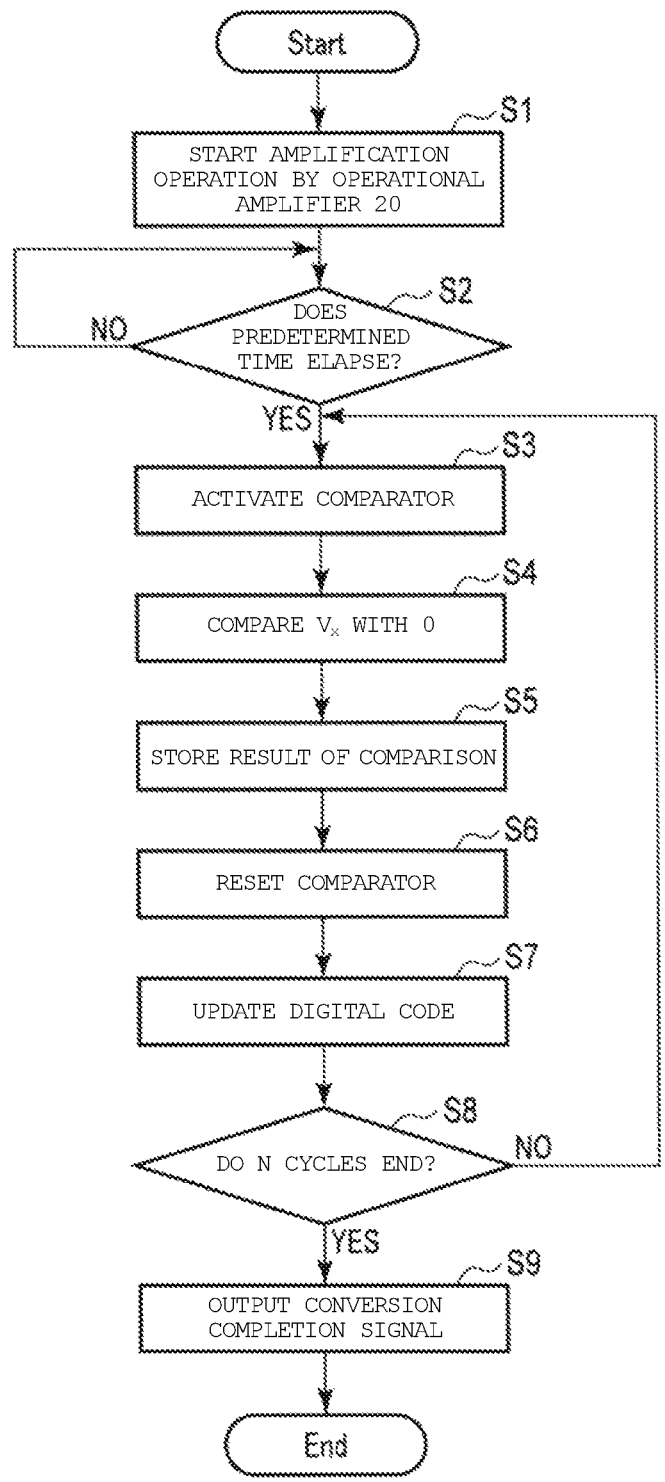
FIG. 4 is a flowchart illustrating a quantizing operation of a quantizer during an amplification phase of the amplifier circuit according to the first embodiment.

Here, FIG. 4 is a flowchart illustrating the quantizing operation of the quantizer 2-1 during the amplification phase of the amplifier circuit according to the first embodiment. First, if the amplification phase is to start, then the logic circuit 22 turns on the switch SW 11 and starts the amplification operation of the operational amplifier 20 (element S1). Thereafter, it is determined whether or not a predetermined period has elapsed from when the switch SW 11 was turned on (element S2). If it is determined that the predetermined period has elapsed (YES in S2), the switch SW 11 is turned off, and the logic circuit 22 activates the comparator 21 (element S3).

Then, the activated comparator 21 compares $V_X$ with 0 (Vcm) and outputs a digital value in accordance with a result of the comparison (element S4). In the following description, it is assumed that the comparator 21 outputs 1 if $V_X$ is greater than 0 and outputs 0 if $V_X$ is less than 0.

The result (digital value) of the comparison output from the comparator 21 is stored in the logic circuit 22 (element S5).

The logic circuit 22 stores the result of comparison and then resets the comparator 21 (element S6). That is, the logic circuit 22 completes the comparison operation by the comparator 21 and then returns the comparator to a state corresponding to a state before the activation (inactivates the comparator).

Then, the logic circuit 22 updates the digital code D to be input to the DAC 3 based on the stored results of the comparison (element S7). The logic circuit 22 updates the digital code D such that $V_X$ approaches 0. Specifically, the logic circuit 22 performs the update such that the digital code D becomes smaller if 1 is input as the result of the comparison and performs the update such that the digital code D becomes larger if 0 is input as the result of the comparison.

Thereafter, the logic circuit 22 determines whether or not the successive approximation operation in the N cycles has been completed (element S8). If the successive approximation operation in the N cycles has been completed (YES in S8), the amplification phase ends. That is, the logic circuit 22 outputs the conversion completion signal to the logic circuit 32 if the amplifier circuit has completed the successive approximation operation and ends the amplification operation even before the end of the predetermined amplification time as otherwise determined by the clock CLK. Thereafter, the sampling circuit 1 starts the sampling phase again based on the clock CLK. In contrast, if the successive comparison operation in the N cycles has not completed (NO in S8), the logic circuit 22 starts the next cycle of the successive approximation operation and activates the comparator 21 again (element S3).

The clock signals CLK supplied to the sampling circuit 1, the quantizer 2-1, the DAC 3, and the ADC 4 are not necessarily the same clock signal CLK.

Figure 5:
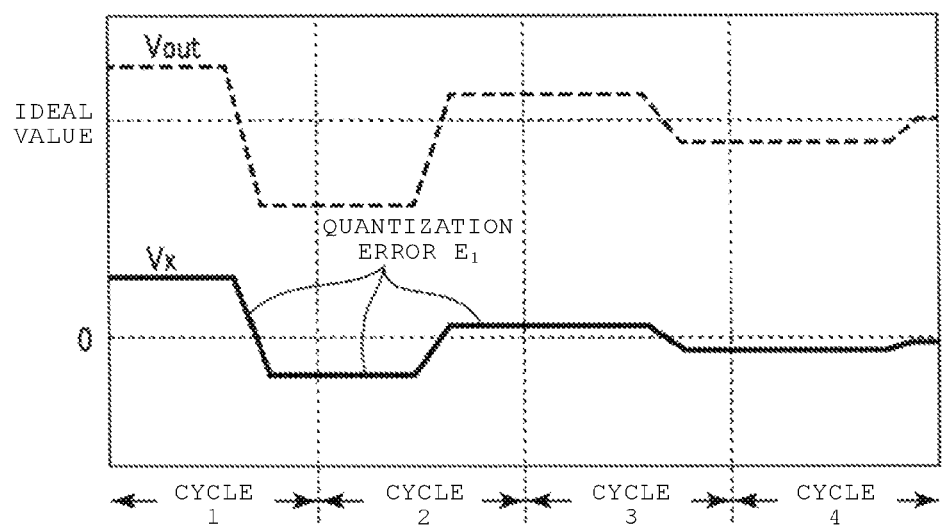
FIG. 5 is a diagram illustrating an output voltage of the quantizer during the amplification phase.
Figure 6:
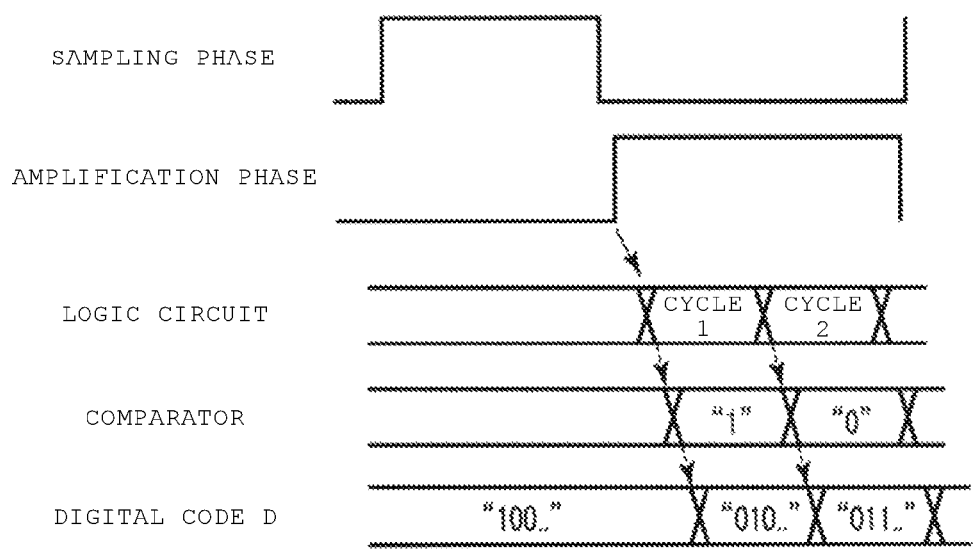
FIG. 6 is a timing chart illustrating operations of the quantizer.

FIG. 5 is a diagram illustrating an output voltage of the quantizer 2-1 in the amplification phase. FIG. 6 is a timing chart illustrating operations of the quantizer 2-1.

As illustrated in FIG. 5, for example, the comparator 21 outputs "1" in a cycle 1 (a successive approximation operation at the first cycle) as illustrated in FIG. 6 if the voltage $V_X$ is greater than 0 when the amplification phase starts. Then, the logic circuit 22 to which "1" is input updates the digital code D so as to become smaller.

As illustrated in FIG. 6, the logic circuit 22 changes the first bit (MSB) to 0 and changes the second bit to 1 if the digital code D (reset value) at the time the amplification phase starts is 100 . . . . In doing so, the digital code D is updated from 100 . . . to 010 . . . .

When the digital code D is updated, then the DAC 3 outputs an electrical charge in accordance with the updated digital code D. If the digital code D is updated so as to become smaller, the DAC 3 outputs the electrical charge such that the output voltage Vout becomes smaller. That is, the electrical charge is extracted from the feedback capacitance $C_F$.

In doing so, the output voltage Vout becomes smaller as illustrated in FIG. 5. Correspondingly, the voltage $V_X$ also becomes smaller. Thereafter, the comparator 21 is reset, and the cycle 1 ends.

If the cycle 1 ends, then a cycle 2 (a successive approximation operation in the second cycle) starts. Since $V_X$ became less than "0" in the cycle 1, the comparator 21 outputs "0" in the cycle 2 as illustrated in FIG. 5. Then, the logic circuit 22 to which "0" is input updates the digital code D so as to become larger.

Since the digital code D became 010 . . . in the cycle 1, the logic circuit 22 updates the third bit from 0 to 1. In doing so, the digital code D is updated from 010 . . . to 011 . . . .

When the digital code D is updated, then the DAC 3 outputs an electrical charge in accordance with the updated digital code D. If the digital code D is updated so as to become larger, the DAC 3 outputs the electrical charge such that the output voltage Vout becomes larger. That is, the feedback capacitance $C_F$ is charged.

In doing so, the output voltage Vout becomes larger as illustrated in FIG. 5. Correspondingly, the voltage $V_X$ also becomes larger. Thereafter, the comparator 21 is reset, and the cycle 2 ends.

Thereafter, the same cycle is repeated up to the N-th cycle. As illustrated in FIG. 5, the voltage $V_X$ approaches 0 and a quantization error $E_1$ becomes smaller every time the successive approximation operation is repeated. Correspondingly, the output voltage Vout approaches an ideal value, and amplification precision of the amplifier circuit is enhanced.

Figure 7:
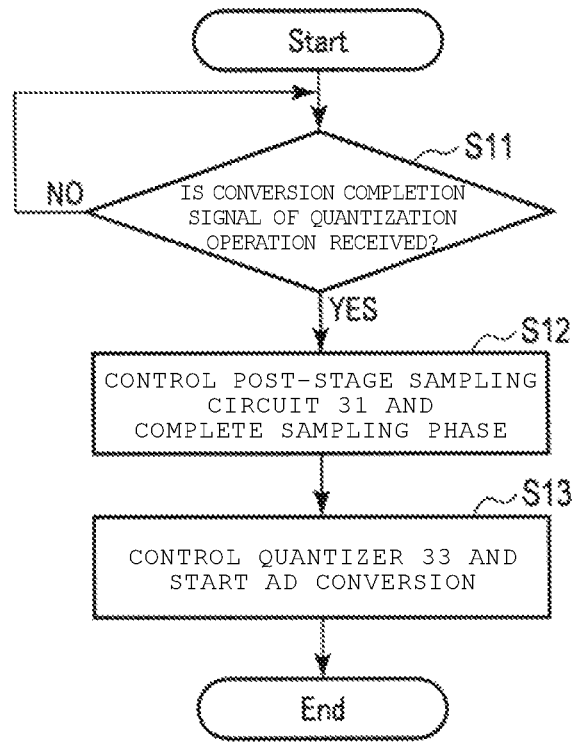
FIG. 7 is a flowchart of operations of a logical circuit.

FIG. 7 is an explanatory flowchart of operations of the logic circuit 32.

The logic circuit 32 controls the switches NSW1 to NSW3 of the later-stage sampling circuit 31 and ends the sampling phase (element S12) if the logic circuit 32 receives the conversion completion signal from the logic circuit 22 (YES in S11).

Then, the logic circuit 32 starts quantization of the voltage sampled by the later-stage sampling circuit 31 in the amplification phase by controlling the quantizer 33 (element S13).

1-3. Effects

Figure 8:
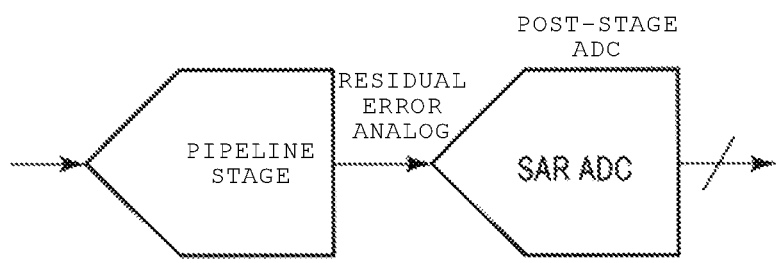
FIG. 8 is a diagram illustrating an example of a connection between the amplifier circuit and a later-stage circuit.

FIG. 8 is a diagram illustrating an example of connection between the amplifier circuit and the later-stage circuit. FIG. 9 is an explanatory diagram of an influence of a leakage current of an output voltage from an amplifier circuit in the related art.

In FIG. 8, it is assumed that a pipeline stage includes an amplifier circuit according to the first embodiment, and a SAR ADC including a sampling circuit according to the first embodiment is connected as a later stage to the pipeline stage. As illustrated in FIG. 9, the amplifier circuit of the pipeline stage repeats the sampling phase and the amplification phase in accordance with timing of the clock CLK. The SAR ADC in the later stage repeats the sampling phase and the AD conversion in accordance with the timing of the clock CLK.

That is, when the pipeline stage is in a sampling phase, the SAR ADC is in an AD conversion phase. If the pipeline stage is in an amplification phase, the SAR ADC is in a sampling phase.

As illustrated in FIG. 9, the operational amplifier 20 of the analog amplifier circuit performs analog amplification during a time period A (a predetermined period) during the amplification phase of the pipeline stage. Thereafter, the comparator 21 performs amplification by the successive approximation operation during a time period B.

According to an amplifier circuit of the related art, the output Vout can approach an ideal voltage (having no residual error) within the amplification period of the pipeline stage by amplification. However, even when the output Vout approaches the ideal voltage (no residual error), a leakage current will still be generated thereafter due to an influence of the switches in the later-stage sampling circuit. Furthermore, such a leakage current increases over time.

Figure 10:
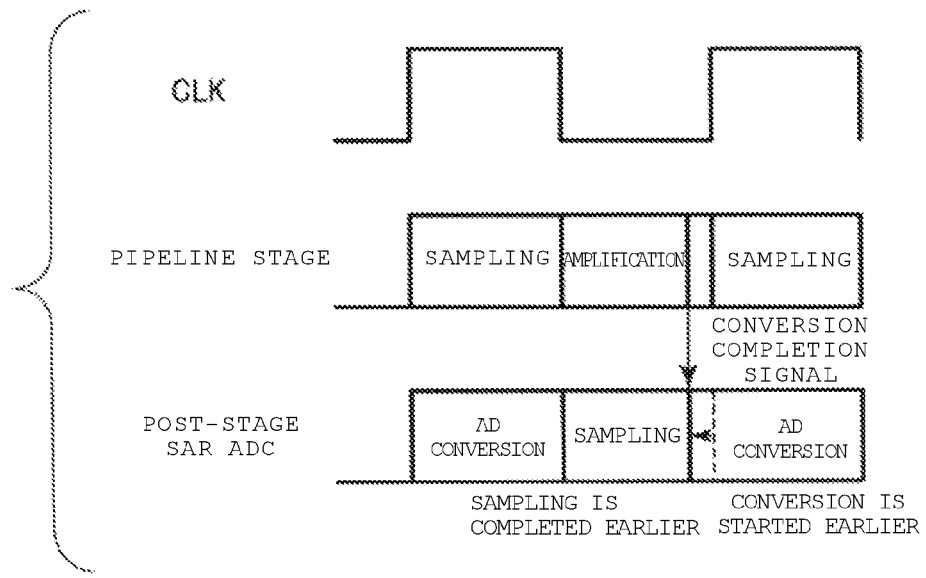
FIG. 10 is a diagram depicting variations in an AD conversion period of a later-stage SAR ADC according to the first embodiment.
Figure 11:
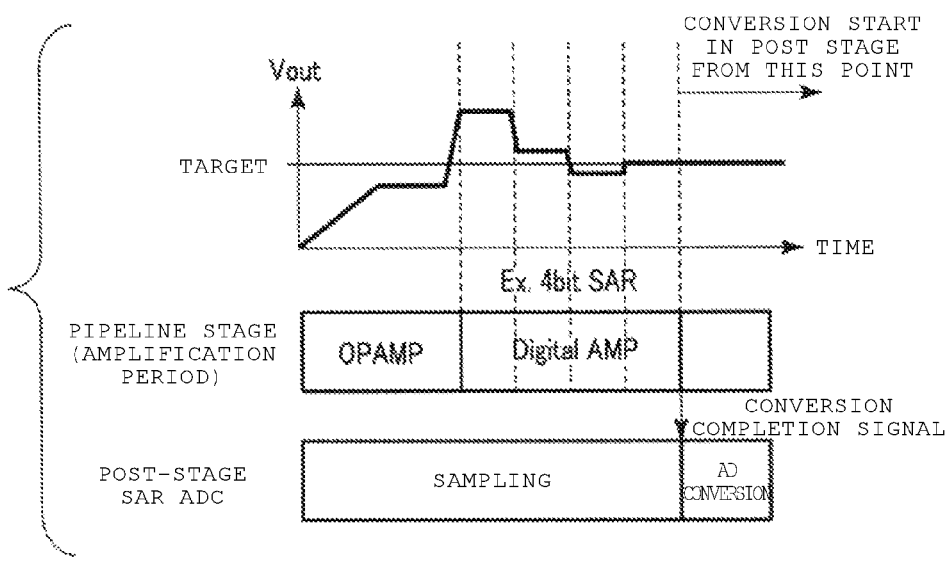
FIG. 11 is a diagram for explaining aspects of a relationship between an output voltage and an amplification period of the amplifier circuit according to the first embodiment.

FIG. 10 is a diagram for explaining variations in the AD conversion period of the later-stage SAR ADC according to the first embodiment. FIG. 11 is an explanatory diagram of a relationship between the output voltage Vout of the amplifier circuit and the amplification period according to the first embodiment.

As described above, the logic circuit 22 outputs the conversion completion signal to the logic circuit 32 when the amplifier circuit completes the amplification by the successive approximation operation even before the end of the predetermined amplification period determined by the clock CLK in the first embodiment. FIG. 11 illustrates an example of a 4-bit successive approximation operation. The logic circuit 22 outputs the conversion completion signal immediately after the 4-bit successive approximation operation has been completed. In FIG. 11, the period represented as "OPAMP" is a period (fixed time) for the amplification processing by the operational amplifier 20, and the period represented as "Digital AMP" is a period for the amplification processing by the comparator 21.

The logic circuit 32 receives the conversion completion signal and then starts the AD conversion operation by the SAR ADC. In doing so, it is possible to perform the later-stage conversion operation immediately after the amplification by the successive approximation operation has been completed, as illustrated in FIGS. 10 and 11, as compared with the amplifier circuit in the related art. As a result, it is possible to prevent the leakage current from influencing the output voltage Vout.

Therefore, the logic circuit 22 outputs the conversion completion signal to the logic circuit 32 after the quantizer 2-1 completes the quantization processing even at a low-speed (low frequency) clock CLK according to the first embodiment. In doing so, it is possible to leave long conversion time for the later-stage circuit.

In the amplifier circuit according to the first embodiment, the SAR-ADC quantizes the voltage $V_X$, and the voltage $V_X$ is made to approach 0 by charging the feedback capacitance $C_F$ with electrical charge in accordance with a digital code. In doing so, the output voltage Vout approaches an ideal value (a voltage obtained by amplifying the input voltage Vin by a predetermined amplification factor).

In the amplifier circuit according to the first embodiment, it may be necessary to increase the number N of cycles of the successive approximation operation in order to enhance the amplification precision. As the number N of cycles increases, the time for the amplification phase increases. However, since the successive approximation operation is generally performed at higher speeds (frequencies) with the decrease in size of CMOS circuitry in recent years, it is possible to mitigate a decrease in the overall operation speed of the amplifier circuit even when the amplification precision is to be enhanced by increasing the number N of the cycles.

Although resolution of the comparator 21 is 1 bit in the above description, the resolution may be two or more bits in some embodiments. By increasing the resolution, it is possible to reduce the total number of cycles of the successive approximation operation and to increase the operation speed of the amplifier circuit.

The operations (the storage of the digital value and the updating of the digital code D) of the logic circuit 22 may be executed in synchronized manner with a clock or may be executed in a non-synchronized, sequential manner.

Furthermore, residual errors (voltage $V_X$) after the successive approximate operation may be integrated to execute noise shaping processing. In doing so, it is possible to further reduce the quantization error $E_1$ and to enhance the amplification precision.

2. Second Embodiment 2-1. Configuration

Figure 12:
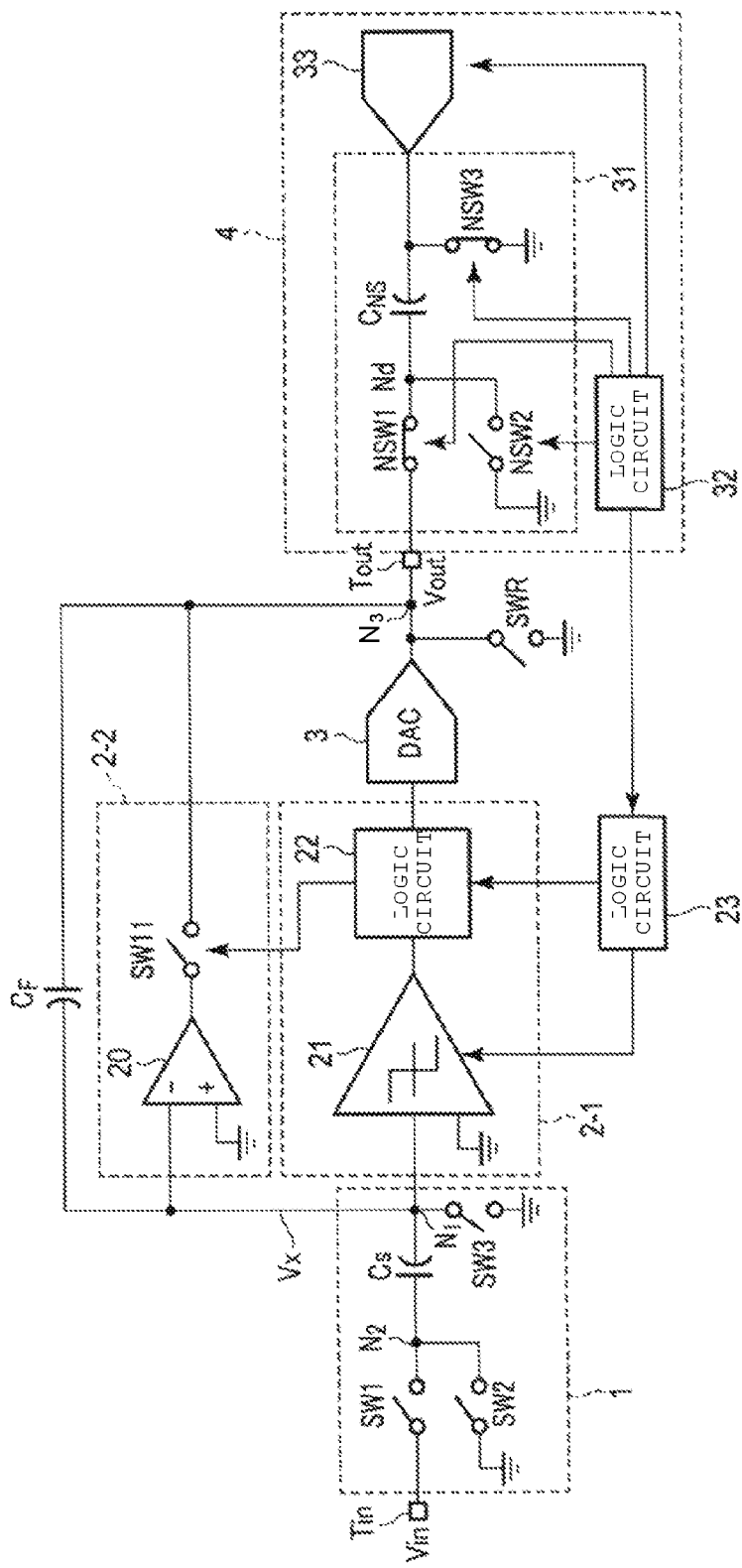
FIG. 12 is a diagram illustrating a configuration of an amplifier circuit according to a second embodiment.

FIG. 12 is a diagram illustrating a configuration of an amplifier circuit according to a second embodiment. The same reference numerals will be given to the same components as those in the first embodiment, and description of repeated elements may be omitted.

The amplifier circuit according to the second embodiment is different from that in the first embodiment in a method of controlling the successive approximation operation.

In the second embodiment, the logic circuit 32 controls the switches NSW1 to NSW3 of the later-stage sampling circuit 31 of the ADC 4 and the quantizer 33 to start the AD conversion operation. The logic circuit 32 outputs a sampling operation completion signal to the logic circuit 23 when the later-stage sampling circuit 31 of the ADC 4 completes the sampling operation, which is unlike the first embodiment.

The logic circuit 23 receives the sampling operation completion signal from the logic circuit 32 and then controls the comparator 21 and the logic circuit 22 to complete the successive approximation operation during the amplification phase. That is, the logic circuit 22 continues the successive approximation operation until the amplification period is competed, even if the SAR-ADC of the quantizer 2-1 otherwise completes the predetermined successive approximation operation.

Since the successive approximation operation in the amplification phase that is continued after the successive approximation operation has been performed a predetermined number of times is a successive approximation operation used for preventing the influence of the leakage current, Least Significant Bit (LSB) comparison can be performed. However, the present disclosure is not limited thereto.

The later-stage sampling circuit 31 controls sampling in the same manner as the sampling circuit 1. That is, the switches NSW1 and NSW3 are turned on while the switch NSW2 is turned off in the later-stage sampling circuit 31. In doing so, the sampling capacitance $C_{NS}$ samples the output voltage Vout of the quantizer 2-1. At this time, the output voltage of the later-stage sampling circuit 31 is 0 V. In the later-stage sampling circuit 31 in FIG. 12, the switches NSW1 and NSW3 are turned off while the switch NSW2 is turned on in the amplification phase. In doing so, the output voltage becomes –Vout.

Here, the quantization operation performed by the quantizer 33 is substantially the same as that performed by the quantizer 2-1. That is, the output voltage Vout from the later-stage sampling circuit 31 is input to the quantizer 33, and the quantizer 33 thus quantizes the output voltage Vout, which is being input to later-stage sampling circuit 31. The quantizer 33 outputs a digital code D as a result of the quantization.

Figure 13:
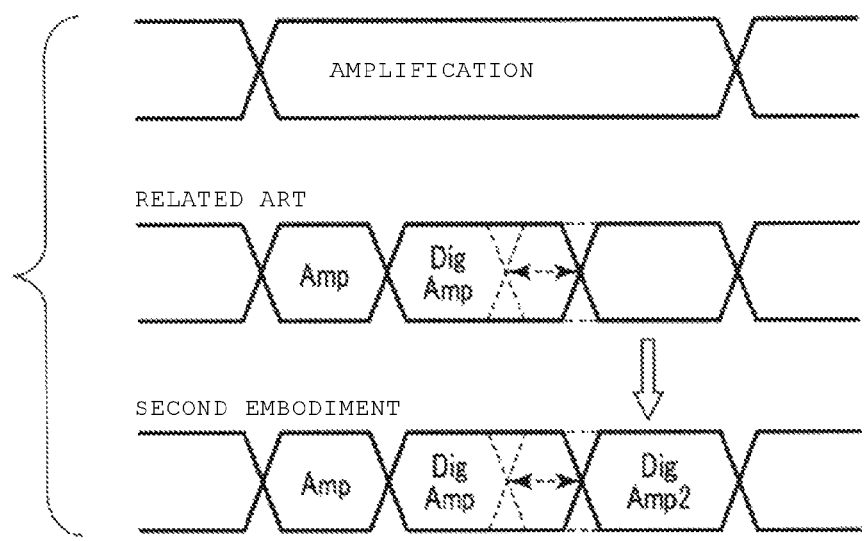
FIG. 13 is a diagram for explaining aspects of timing of an amplification operation during an amplification phase of the amplifier circuit according to the second embodiment.

FIG. 13 is an explanatory diagram of timing of the amplification operation in the amplification phase of the amplifier circuit according to the second embodiment. As illustrated in the drawing, the comparator 21 performs the amplification processing by the successive approximation operation after the amplification processing (fixed time) by the operational amplifier 20 in the amplification phase. The time required for the amplification processing by the successive approximation operation varies depending on factors such as a performance of the amplifier circuit (not synchronized).

According to the amplifier circuit in the related art, amplification processing ("Amp" and "Dig Amp") is not continued until the end of the amplification period of the amplification phase when the amplification processing is completed before the end of the amplification period.

In contrast, amplification processing by a second successive approximation operation ("Dig Amp2") is continuously performed even when the amplification processing for the predetermined successive approximation operation has been completed according to the amplifier circuit of the second embodiment (the additional period is represented as "DigAmp2" in FIG. 13).

In FIG. 13, the period represented as "Amp" is a period for the amplification processing by the operational amplifier 20, and the period represented as "DigAmp" is a period (first amplification period) for the amplification processing by the comparator 21. The period represented as "DigAmp2" is a period (second amplification period) for the amplification processing by the comparator 21 according to the second embodiment, which is continuously performed after the first amplification period until the ending of the fixed period for the amplification operation during the amplification phase.

Figure 14:
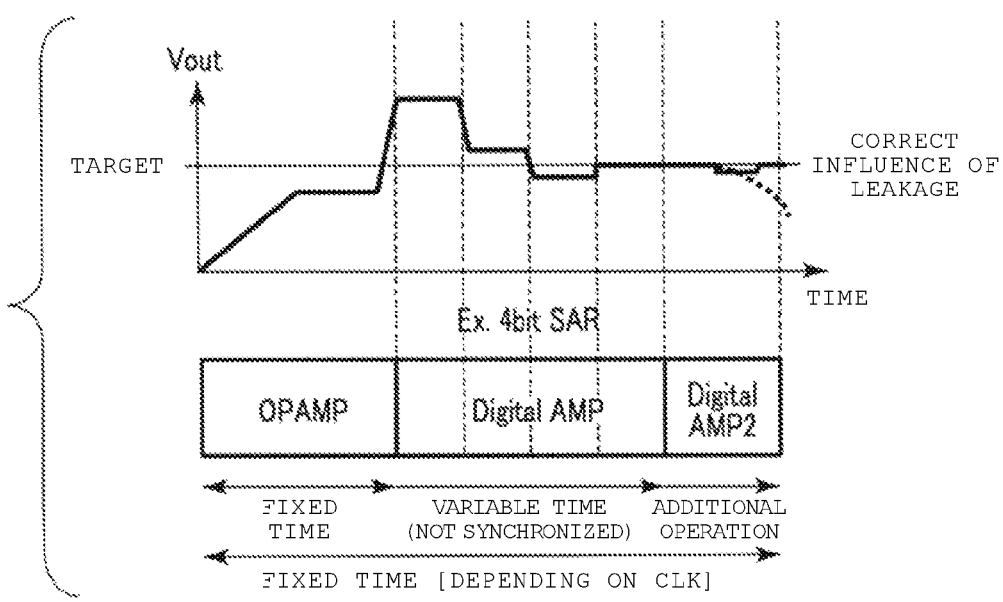
FIG. 14 is a diagram for explaining aspects of enhanced properties of an output voltage of the amplifier circuit according to the second embodiment.

FIG. 14 is a diagram for explaining aspects of the enhanced properties of the output voltage Vout of the amplifier circuit according to the second embodiment. As illustrated in the FIG. 14, the amplification processing of the second successive approximation operation is performed (the period represented as "DigAmp2" in FIG. 14) even after the amplification processing for the predetermined successive approximation operation has been completed in the amplification period. Therefore, the ending of the entire amplification period depends on the clock CLK and is thus fixed time. The entire amplification period can be represented as follows.

Entire amplification period=an amplification period by operational amplifier 20 (fixed time, OPAMP)+an amplification period by comparator 21 (not synchronized, variable time, Digital AMP)+an additional amplification period (period represented as "DigAmp2" in FIG. 14) However, whenever the logic circuit 23 receives the sampling operation completion signal from the logic circuit 32 in the additional amplification period, the additional amplification processing is ended, and the processing moves on to the sampling phase.

2-2. Operations

Figure 15:
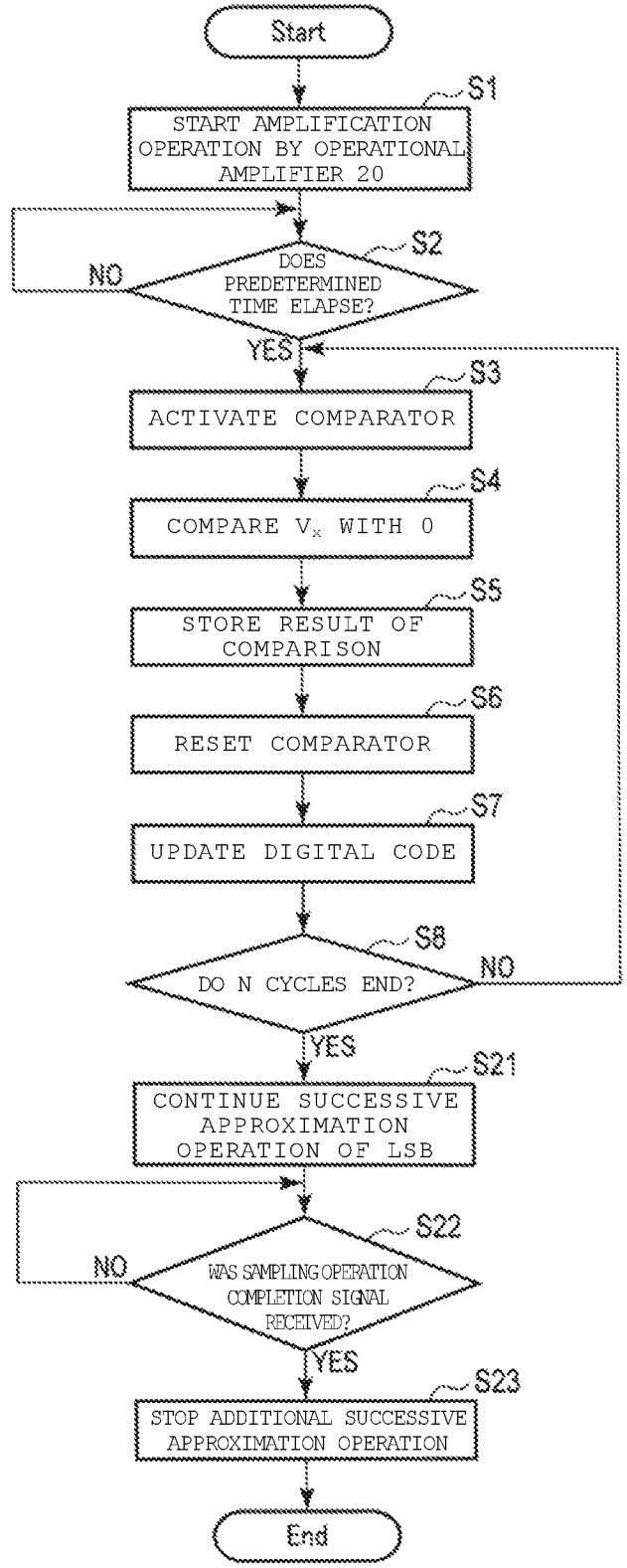
FIG. 15 is a flowchart illustrating a quantizing operation of a quantizer during the amplification phase of the amplifier circuit according to the second embodiment.

FIG. 15 is a flowchart illustrating a quantizing operation of the quantizer 2-1 in the amplification phase of the amplifier circuit according to the second embodiment. Since the operations in S1 to S8 are substantially the same as those of the amplifier circuit in the first embodiment as described in conjunction with in FIG. 4, the repeated description thereof will be omitted.

Even after the predetermined amplification processing has been completed in S1 to S8 (the periods of "OPAMP" and "Digital AMP" in FIG. 14), the logic circuit 23 continues an additional successive approximation operation by controlling the comparator 21 and the logic circuit 22 (element S21).

Since this additional successive approximation operation is used for limiting the adverse influence of the leakage current on the level of the output voltage Vout, a LSB comparison is performed in the second embodiment as described above.

Thereafter, once the logic circuit 23 receives the sampling operation completion signal from the logic circuit 32 (YES in S22), the logic circuit 23 stops this additional successive approximation operation by controlling the comparator 21 and the logic circuit 22 (element S23), and completes the processing in the amplification phase of the amplifier circuit. If the sampling operation completion signal has not been received by the end of the period of the amplification phase, the processing is completed, and moves on to the next sampling phase.

2-3. Effects

Therefore, since the amplification processing by the successive approximation operation is continuously performed until the sampling operation completion signal is received in the amplification period in the amplifier circuit according to the second embodiment, it is possible to correct the influence of the leakage current on the output voltage Vout as illustrated in FIG. 14. By performing such control, the leakage current does not substantially influence the sampling circuit in the later stage even when a low-speed clock CLK is used.

In the first embodiment, the logic circuit 22 was illustrated in connection with the amplifier circuit in the first stage, and the logic circuit 32 is illustrated in connection with the later stage. In the second embodiment, the logic circuits 22 and 23 are illustrated as associated with the amplifier circuits in the first stage, and the logic circuit 32 is illustrated as associated with the later-stage circuit. However, the logic circuits 22 and 23 may also be implemented as a single, combined logic circuit. Alternatively, the logic circuits 22 and 23 and the logic circuit 32 may also be implemented as a combined, single logic circuit. The positioning of the logic circuits need not be within any particular portion of the amplifier circuit(s). Additionally, various components of the logic circuit (s) may be distributed in different portions of the amplifier circuit(s).

3. Other Embodiments

3-1. Other Switched Capacitor Circuit

Although an amplifier circuit is demonstrated as a switched capacitor circuit in the previous example embodiments, the switched capacitor circuit may be an integrator in some embodiments.

Figure 16:
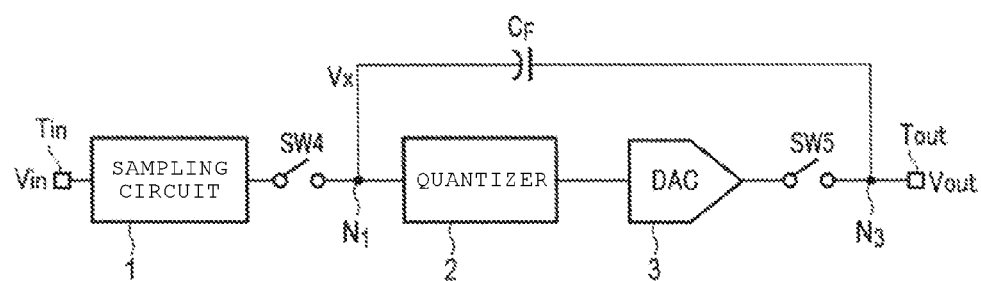
FIG. 16 is a diagram illustrating an example of an integrator according to an embodiment.

FIG. 16 is a diagram illustrating an example of an integrator according to the embodiment. As illustrated in FIG. 16, an integrator includes switches SW4 and SW5, but is without a reset switch SWR. The other configurations are substantially the same as those in the first embodiment.

In the integrator, the switch SW4 (first switch) is connected between the sampling circuit 1 and the feedback capacitance $C_F$. The switch SW4 is turned off in the sampling phase and is turned on in the amplification phase. Although the switch SW4 is connected between the sampling circuit 1 and the node $N_1$ in the example in FIG. 16, the switch SW4 may instead be connected between the node $N_1$ and the feedback capacitance $C_F$.

The switch SW5 (second switch) is connected between the DAC 3 and the feedback capacitance $C_F$. The switch SW5 is turned off in the sampling phase and is turned on in the amplification phase. Although the switch SW5 is connected between the DAC 3 and a node $N_3$ in the example in FIG. 16, the switch SW5 may instead be connected between the node $N_3$ and the feedback capacitance $C_F$.

In the integrator, the switches SW4 and SW5 are turned off in the sampling phase while the feedback capacitance $C_F$ is left in a floating state. In doing so, the electric charge accumulated in the feedback capacitance $C_F$ is held (stored). Therefore, an integration operation can be performed.

According to this embodiment, it is possible to reduce power consumption of the integrator by using the amplifier circuit described in conjunction with the first embodiment to form the integrator. The integrator can be applied to a delta-sigma ADC, for example.

Figure 17:
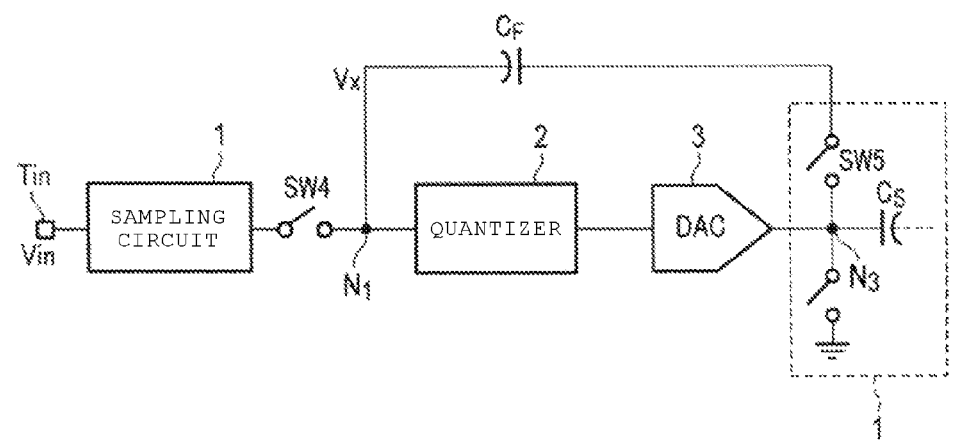
FIG. 17 is a diagram illustrating a modification example of the integrator.

If the sampling circuit 1 is connected as a later stage of the integrator according to this embodiment, it is preferable to also use the switch SW5 as a switch for the sampling circuit 1 of the later stage as illustrated in FIG. 17. With such a configuration, it is possible to reduce the total number of switches and thus to reduce the required circuit area.

Figure 18:
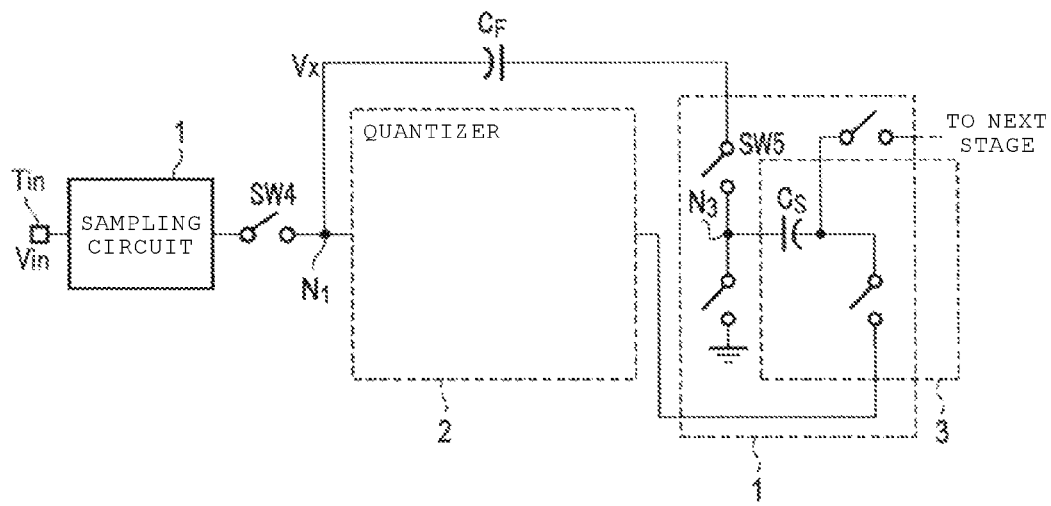
FIG. 18 is a diagram illustrating another modification example of the integrator.

If the DAC 3 is a capacitance-type DAC, the capacitive element of the DAC 3 in FIG. 17 and the sampling capacitance $C_S$ of the sampling circuit 1 of the later stage may be commonly used. FIG. 18 is a diagram illustrating an example of an amplifier circuit in which the capacitive element of the DAC 3 and the sampling capacitance $C_S$ in the later stage are commonly used.

The sampling capacitance $C_S$ in the later stage of the amplifier circuit in FIG. 18 operates as the sampling capacitance of the sampling circuit 1 of the later stage during the sampling phase and operates as the capacitive element of the DAC 3 during the amplification phase. With such a configuration, it is possible to reduce the total number of capacitive elements and thus to reduce the circuit area.

Figure 19:
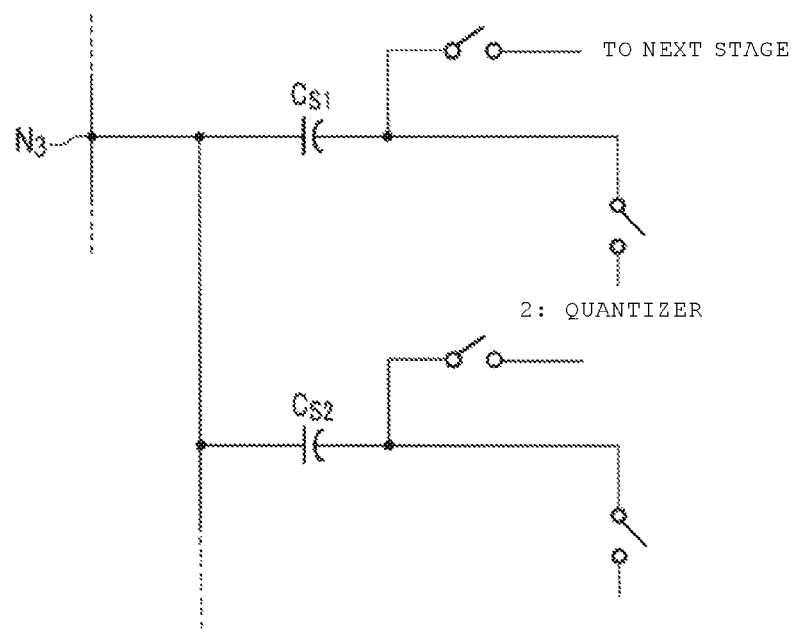
FIG. 19 is an enlarged view of a DAC of the integrator depicted in FIG. 18.

Although only one capacitive element of the DAC 3 is illustrated in the example of FIG. 18, a plurality of capacitive elements $C_{S1}$, $C_{S2}$, . . . can be connected in parallel as illustrated in FIG. 19. The total number of capacitive elements may be determined in accordance with the precision required from the DAC 3.

3-2. Other Examples of Quantizer 2-1

Although the comparator 21 and the logic circuit 22 form the quantizer 2-1 in the aforementioned embodiments, the configuration of the quantizer 2-1 is not limited thereto.

Figure 20:
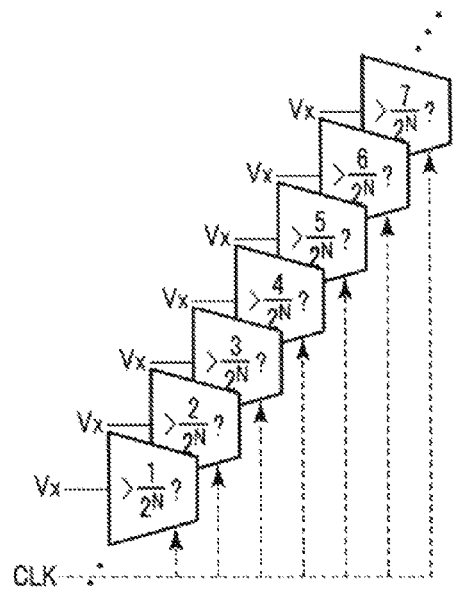
FIG. 20 is a diagram illustrating an example of the quantizer.

FIG. 20 is a diagram illustrating another example of the quantizer 2-1. The quantizer 2-1 in FIG. 20 is an N-bit flash-type ADC and includes $2^N$ comparators connected in parallel. The voltage V and a reference voltage corresponding to each bit are input to each comparator, and each comparator outputs 0 or 1 in accordance with a result of comparison.

The quantizer 2-1 in some embodiments may be a flash-type ADC, a pipeline-type ADC, or a delta-sigma-type ADC.

3-3. Other Examples of a Later-Stage Circuit

Although an ADC 4 including a sampling circuit is exemplified as the later-stage circuit in the aforementioned embodiments, any later-stage circuit may be used as long as the later-stage circuit includes the sampling circuit. For example, the later-stage circuit may be a pipeline stage of the pipeline-type ADC 4. The pipeline stage is one of internal components of a pipeline-type ADC.

Figure 21:
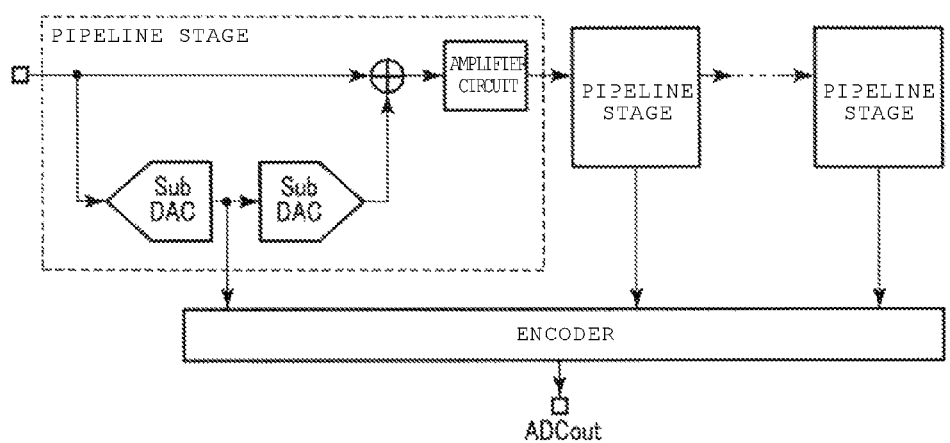
FIG. 21 is a diagram illustrating an example of a pipeline-type analog-digital converter (ADC) according to an embodiment.

FIG. 21 is a diagram illustrating an example of a pipeline-type ADC according to this embodiment. As illustrated in FIG. 21, the pipeline-type ADC includes a plurality of pipeline stages that are continuously connected to each other and an encoder that encodes an output signal from each pipeline stage and outputs a digital code ADCout as a result of AD conversion.

Each pipeline stage includes a sub ADC, a sub DAC, a residual error operation circuit (subtractor), and an amplifier circuit.

The sub ADC AD converts the analog signal input to the pipeline stage and outputs a result of the AD conversion to the encoder and the sub DAC. The sub DAC DA converts the result from the AD conversion and outputs an analog signal. The residual error operation circuit subtracts the analog signal output from the sub DAC from the analog signal input to the pipeline stage and outputs a residual error signal. The amplifier circuit amplifies the residual error signal output from the residual error operation circuit and inputs the result to the next pipeline stage.

The pipeline-type ADC according to this embodiment may include the amplifier circuit according to any one of the aforementioned embodiments as the amplifier circuit that amplifies the residual error signal. With such a configuration, it is possible to enhance AD conversion precision of the pipeline-type ADC and to reduce power consumption.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A switched capacitor circuit, comprising:
a first sampling circuit having a first sampling capacitance element and receiving an input voltage and outputting a sampled voltage according to a first sampling operation;
a quantizer configured to quantize the sampled voltage output from the first sampling circuit and output a quantized value corresponding to the sampled voltage;
a digital-to-analog converter that outputs an analog signal in accordance with the quantized value from the quantizer; and
a first logic circuit configured to output an instruction to start a sampling operation of a second sampling circuit configured to sample the analog signal output from the digital-to-analog converter when the quantizer completes quantization of the sampled voltage.

2. The switched capacitor circuit according to claim 1, wherein the digital-to-analog converter is a capacitance-type DAC.

3. The switched capacitor circuit according to claim 1, wherein the digital-to-analog converter is a resistance-type DAC.

4. The switched capacitor circuit according to claim 1, wherein
the digital-to-analog converter is a capacitance-type DAC including a capacitive element, and
the capacitive element is used as a sampling capacitance of the second sampling circuit connected to the digital-to-analog converter and receiving the analog signal from the digital-to-analog converter.

5. The switched capacitor circuit according to claim 1, wherein the second sampling circuit is in an analog-to-digital converter.

6. The switched capacitor circuit according to claim 1, wherein the second sampling circuit is a pipeline-stage sampling circuit.

7. The switched capacitor circuit according to claim 1, wherein the first sampling circuit is further configured to cause the quantizer to perform a quantization operation until the second sampling circuit completes the second sampling operation.

8. The switched capacitor circuit according to claim 1, further comprising:
a reset switch connected between an output of the digital-to-analog converter and a ground terminal.

9. A switched capacitor circuit, comprising:
a first sampling circuit having a first sampling capacitance and receiving an input voltage and outputting a sampled voltage according to a first sampling operation;
a quantizer configured to quantize the sampled voltage output from the first sampling circuit and output a quantized value according to the sampled voltage;
a digital-to-analog converter that outputs an analog signal in accordance the quantized value from the quantizer; and
a first logic circuit configured to cause the quantizer to perform a quantization operation until a second sampling circuit completes a second sampling operation on the analog signal output from the digital-to-analog converter.

10. The switched capacitor circuit according to claim 9, wherein the digital-to-analog converter is a capacitance-type DAC.

11. The switched capacitor circuit according to claim 9, wherein the digital-to-analog converter is a resistance-type DAC.

12. The switched capacitor circuit according to claim 9, wherein
the digital-to-analog converter is a capacitance-type DAC including a capacitive element, and
the capacitive element is used as a sampling capacitance of the second sampling circuit connected to the digital-to-analog converter and receiving the analog signal from the digital-to-analog converter.

13. The switched capacitor circuit according to claim 9, wherein the second sampling circuit is an analog-to-digital converter.

14. The switched capacitor circuit according to claim 9, wherein the second sampling circuit is a pipeline-stage sampling circuit.

15. A switched capacitor circuit, comprising:
an amplifier circuit connected in parallel with a feedback capacitance between a first node and a second node and configured to amplify a first voltage at the first node to a target voltage at the second node;
a sampling circuit connected to the second node; and
a first logic circuit configured to output a signal for starting an operation of a sampling circuit when the amplifier circuit completes amplification to the target voltage before an end a clock cycle of the amplifier circuit.

16. The switched capacitor according to claim 15, wherein the amplifier circuit includes an operational amplifier and a digital-to-analog converter connected in parallel between the first and second nodes.

17. The switched capacitor according to claim 16, wherein the amplifier circuit further includes a comparator connected between the first node and the digital-to-analog converter.

18. The switched capacitor according to claim 16, wherein
the digital-to-analog converter is a capacitance-type DAC including a capacitive element, and
the capacitive element is used as a sampling capacitance of the sampling circuit.

19. The switched capacitor according to claim 15, wherein the first logic circuit is configured to cause a quantizer in the amplifier circuit to complete quantization before the end of the clock cycle when a signal indicating completion of a sampling process of the sampling circuit is received.

20. The switched capacitor according to claim 15, wherein the first logic circuit is configured to cause a quantizer in the amplifier circuit to continue a quantization operation until a signal indicating completion of a sampling process of the sampling circuit has been received.

* * * * *